US010394119B2

United States Patent
Berg (10) Patent No.: US 10,394,119 B2
(45) Date of Patent: Aug. 27, 2019

(54) SYSTEM AND METHOD FOR FABRICATING MINIATURE STRUCTURES ON A FLEXIBLE SUBSTRATE

(71) Applicant: Carpe Diem Technologies, Inc., Franklin, MA (US)

(72) Inventor: John S. Berg, Franklin, MA (US)

(73) Assignee: CARPE DIEM TECHNOLOGIES, INC., Franklin, MA (US)

( * ) Notice: Subject to any disclaimer, the term of this patent is extended or adjusted under 35 U.S.C. 154(b) by 0 days.

(21) Appl. No.: 15/712,865

(22) Filed: Sep. 22, 2017

(65) Prior Publication Data

US 2018/0074400 A1    Mar. 15, 2018

Related U.S. Application Data

(63) Continuation of application No. 14/665,638, filed on Mar. 23, 2015, now Pat. No. 9,804,488.

(60) Provisional application No. 61/968,641, filed on Mar. 21, 2014.

(51) Int. Cl.
*G01B 11/02* (2006.01)
*G03F 7/00* (2006.01)

(52) U.S. Cl.
CPC .................. *G03F 7/0002* (2013.01)

(58) Field of Classification Search
CPC ........ G03F 7/0002; G03F 1/42; G03F 9/7073; H01L 2223/54426; G01N 21/89; G01N 21/8901; G01N 21/8914; G01N 2223/642; G01N 2223/6425; Y10T 483/138; Y10T 83/141; B65H 23/00; B65H 23/044; B65H 23/048; B65H 26/02

USPC .......................................................... 356/508
See application file for complete search history.

(56) References Cited

U.S. PATENT DOCUMENTS

| 2008/0218713 | A1 | 9/2008 | Shibazaki |
| 2008/0316582 | A1* | 12/2008 | Danner ............... G02B 26/026 359/296 |
| 2009/0081813 | A1 | 3/2009 | Aguado Granados et al. |
| 2010/0304309 | A1 | 2/2010 | Theis et al. |
| 2010/0065191 | A1* | 3/2010 | Hatano ............... B29C 65/5042 156/157 |
| 2010/0243698 | A1* | 9/2010 | Hashimoto .......... B65H 23/048 226/21 |
| 2011/0128520 | A1 | 6/2011 | Van Bilsen et al. |

(Continued)

*Primary Examiner* — Kara E. Geisel
*Assistant Examiner* — Jonathon Cook
(74) *Attorney, Agent, or Firm* — Kriegsman & Kriegsman (57) ABSTRACT

A system for the fabrication of patterned miniature structures, such integrated circuits, includes a continuous, flexible substrate that is transported by rollers to a series of processing stations. To ensure proper alignment amongst the various stations, the substrate is provided with at least one fiducial that is raised above its top surface a height that maximizes optical contrast when viewed interferometrically. At least one processing station includes an optical device that is capable of both interferometrically identifying the fiducial for alignment purposes and subsequently illuminating the substrate with a modifiable light pattern as part of a photolithographic process. Fiducials can also be used to identify gross geometric variances in the substrate caused by external factors, such as heat and moisture. In turn, a web adjustment element can be used to apply selective heat or tension to the substrate in order to correct such geometric variances.

6 Claims, 7 Drawing Sheets

(56) References Cited

U.S. PATENT DOCUMENTS

| | | |
|---|---|---|
| 2012/0015460 A1 | 1/2012 | Donaher |
| 2012/0062863 A1 | 3/2012 | Bijnen et al. |
| 2012/0147356 A1 | 6/2012 | Necsoiu et al. |
| 2013/0009329 A1* | 1/2013 | Hofeldt ............... G02B 3/0075 264/1.6 |
| 2015/0231874 A1* | 8/2015 | Jin ........................... B41F 5/24 101/483 |
| 2015/0279748 A1* | 10/2015 | Spath ..................... H01L 21/78 438/14 |

* cited by examiner

SYSTEM AND METHOD FOR FABRICATING MINIATURE STRUCTURES ON A FLEXIBLE SUBSTRATE

FIELD OF THE INVENTION

The present invention relates generally to the fabrication of miniature structures and, more particularly, to the fabrication of miniature structures on flexible substrates.

BACKGROUND OF THE INVENTION

The miniaturization of technological structures is an ever-increasing trend across a wide range of fields including, but not limited to, electronics, biotechnology and electro-optics. In the art, the fabrication of miniaturized technological structures is commonly referred to as microfabrication when used to manufacture structures measured in microns ($10^{-6}$ m) and nanofabrication when used to manufacture structures measured in nanometers ($10^{-9}$ m) or smaller. As can be appreciated, it has been found that the resultant size of miniaturized structures is often limited by constraints associated with the particular fabrication process utilized to construct such structures.

The fabrication of miniature electrical devices, such as integrated circuits, is most commonly achieved using a multi-stepped, lithographic process in which patterned layers are sequentially formed onto a common substrate in a stacked relationship. Specifically, as part of the fabrication process, a uniform layer of resist is typically deposited onto the top surface of a flattened substrate. Thereafter, each miniaturized pattern is transferred into the layer of resist, for example, through exposure to light directed through a patterned mask (i.e. photolithography) or through direct mechanical deformation (i.e. imprint lithography).

In photolithography, the optically exposed areas are reacted and then the resist is developed by rinsing it in a bath. When positive photoresist is utilized, the reacted area becomes soluble and is rinsed away. When negative photoresist is utilized, the unexposed area is rinsed away. Effectively, a positive or negative template is created, which is left on the surface of the substrate, through the above-described exposure and development process. In a subsequent step, the entire surface is processed, for instance, by etching the surface, reacting the surface (e.g. as in doping to create a semiconductor), evaporating the surface, or depositing onto the surface, all in a patterned way through the photoresist template. Once the desired patterns are formed on the substrate, any remaining resist is then removed. In this manner, a plurality of miniature structures can be efficiently constructed onto a common substrate.

A semiconductor wafer (e.g. a silicon wafer) most commonly serves as the substrate on which miniature electrical devices are constructed using fabrication techniques of the type as described above. As can be appreciated, semiconductor wafers are relatively rigid and stable in nature and, as such, serve as a suitable construct on which to perform the various steps of the device manufacturing process.

However, it has becoming increasingly desirable in the art for miniature structures to be fabricated on thin, flexible substrates. The use of a thinner, more flexible substrate introduces a number of notable advantages over semiconductor wafers including, but not limited to, a significant reduction in the device size scale (e.g. in thickness), an expanded range of potential applications based on the flexible construction of the device, as well as enhanced manufacturing capabilities by incorporating the substrate as part of a continuous web, or roll.

Although desirable for the reasons set forth above, the use of thin, flexible substrates on which to fabricate miniature structures introduces a number of notable manufacturing challenges. In particular, it has been found that certain external factors, such as environmental conditions, can greatly affect geometric aspects of the substrate. For instance, a flexible substrate constructed out of polyethylene terephthalate (PET) (i) has a thermal coefficient of expansion which is approximately 30 times greater than silicon, (ii) has stiffness which is approximately $\frac{1}{50}^{th}$ the stiffness of silicon, and (iii) could experience a change in volume as great as 0.5% upon exposure to moisture whereas, under similar conditions, silicon would not experience a change in volume.

As a result, a thin, flexible substrate is prone to stretch, contract, warp or otherwise deform in one or more dimensions in response to direct exposure to heat, moisture or tension. The creation of these types of variances in the structural form of the substrate can affect the level of precision by which each pattern is formed, largely due to issues in properly aligning the substrate throughout the various fabrication stages. This lack of precision introduced into the fabrication process can, in turn, significantly compromise the quality of the resultant product, especially as it relates to fabrication of nanometer-scale features and designs.

A low cost, well-known solution for deterministically producing very precise features in a miniature structure is to fabricate the structure through a process known in the art as block copolymer (BCP) self-assembly. BCP self-assembly allows for the fabrication of flexible structures in various shapes of micron to nanometer feature size by linking molecules together according to molecular weight and stress biases over a smooth or an embossed surface (e.g. through the application of a coating which is then evaporated or developed under heat or other actinide energy). The aforementioned process thereby enables the structure to undergo self-assembly in a manner that is self-consistent but not connected to any macro feature (i.e. not wired to the outside world). However, they may be aligned and oriented relative to an embossed surface on which they were developed or grown.

Although well-known in the art, the fabrication of miniature structures using block copolymer self-assembly often requires means for physically connecting the structure to a larger deterministic circuit in order to allow for the delivery of power and/or communication signals therebetween. As a result of this connection requirement, the entire fabrication process is rendered considerably more complex and may render the microfabrication useless unless some means to wire and align the self-assembled parts to the macro world is achieved.

SUMMARY OF THE INVENTION

It is an object of the present invention to provide a new and improved system and method for fabricating miniature structures on a flexible substrate.

It is another object of the present invention to provide a system and method for fabricating miniature structures on a flexible substrate with a high level of precision.

It is yet another object of the present invention to provide a system and method as described above that allows for the fabrication of miniature structures at a microscopic or nanoscopic scale.

It is still another object of the present invention to provide a system and method as described above that detects and compensates for variances in the geometric aspects of the substrate caused by external factors, such as environmental conditions.

It is yet still another object of the present invention to provide a system as described above that has a limited number of parts, is inexpensive to implement, and is easy to use.

Accordingly, as one feature of the present invention, there is provided a system for fabricating miniature structures, the system comprising (a) a flexible substrate on which the miniature structures are fabricated, the flexible substrate comprising a top surface, a bottom surface, and a fiducial, the fiducial having an reference surface that lies in a different plane than the top surface, and (b) an optical device for illuminating the flexible substrate with a source light to interferometrically detect information relating to the fiducial, the source light being of a first wavelength and a first amplitude.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF THE INVENTION

System 11 for the Fabrication of Miniature Structures

Figure 1:
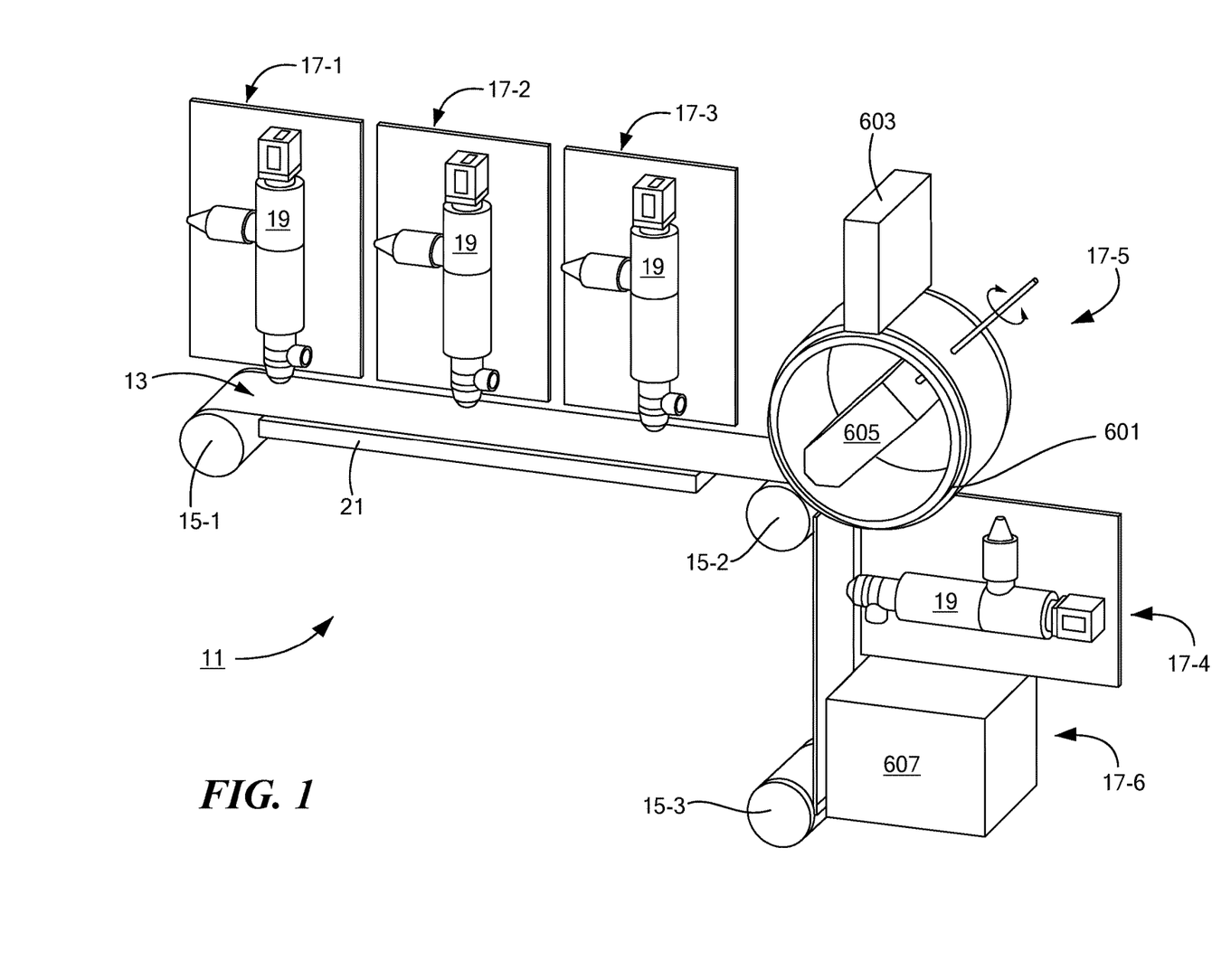
FIG. 1 is a front perspective view of a system for fabricating miniature structures on a flexible substrate, the system being constructed according to the teachings of the present invention.

Referring now to FIG. 1, there is shown a first embodiment of a system for fabricating miniature structures on a flexible substrate, the system being constructed according to the teachings of the present invention and identified generally by reference numeral 11. As will be explained further in detail below, system 11 is specifically designed to detect and compensate for variances in the geometric aspects of the flexible substrate caused by external factors, such as environmental conditions, thereby ensuring proper alignment of the flexible substrate throughout the various stages of the fabrication process.

System 11 comprises a continuous substrate, or web, 13 that is sequentially transported by rollers 15-1 thru 15-3 to a series of processing stations 17-1 thru 17-6. Together, stations 17 are responsible for, inter alia, patterning layers of material on substrate 13 in such a manner so as to yield the desired miniature structure.

As defined herein, miniature structure denotes any device or feature of a limited size (e.g. at micrometer scales, nanometer scales or smaller) that is fabricated on a substrate through a sequence of patterning steps which rely upon, inter alia, embossing, optical masking, and/or image projection. For instance, a miniature structure encompasses, but is not limited to, an integrated circuit for a semiconductor device, such as a transistor or a microprocessor.

As will be explained further below, each of processing stations 17-1 thru 17-4 is provided with an optical device 19 that is capable of not only directing light onto substrate 13 in a particular pattern (i.e. as part of a photolithographic patterning step) but also detecting one or more fiducials (i.e. fixed bases of comparison, or markers) provided on substrate 13. By detecting fiducials on substrate 13 at various stages of the fabrication path, proper alignment of substrate 13 can be ensured among the series of processing stations 17, thereby allowing for the fabrication of very precise, small scale structures, which is a principal object of the present invention.

Most notably, the information received through the detection of fiducials by each optical device 19 can be used to identify larger geometric variances in substrate 13 (e.g. distortion or non-uniform scaling) caused by external factors, such as heat, moisture and the like. To compensate for the presence of a geometric variance in substrate 13, a web adjustment element 21 is preferably provided along the fabrication path to selectively treat substrate 13 in such a manner to eliminate the variance (i.e. to restore substrate 13 to its original geometry), as will be explained further below. In this manner, system 11 is adequately designed not only to adjust for undesired spatial variances (i.e. changes in position or orientation) of substrate 13 relative to each processing station 17 but also to correct for undesired geometric variances (i.e. changes in the overall geometry) in the substrate 13 itself caused from exposure to certain external factors. As such, system 11 is constructed to effectively compensate for common alignment challenges that are introduced through the use of a substrate 13 that is both thin and flexible in nature.

Construction of Substrate 13

Substrate 13 is preferably constructed as a continuous web of a thin, flexible material, such as a ribbon of polymer material. As referenced above, the thin, flexible construction of substrate 13 streamlines the fabrication process and allows for the production of structures that are both limited in size and available for use in a wide range of potential applications, which is highly desirable.

Figure 2:
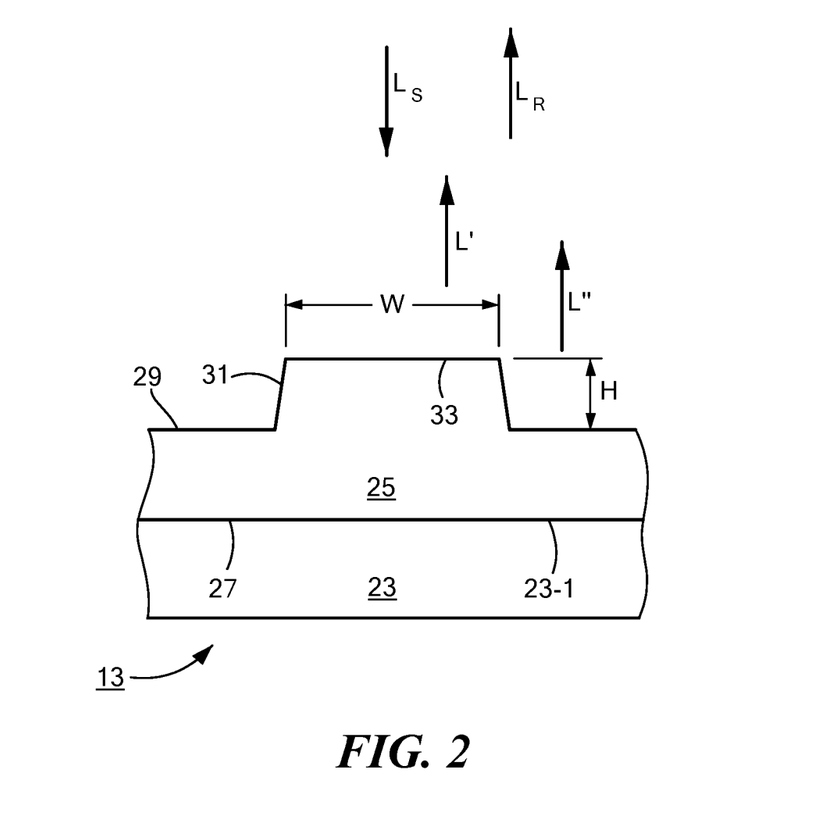
FIG. 2 is an enlarged, fragmentary, section view of a sample segment of the flexible substrate shown in FIG. 1.

As seen in FIG. 2, substrate 13 includes a base layer 23 and a highly reflective reference layer 25 that are formed together to yield a unitary, continuous strip. As can be seen, reference layer 25 includes a generally flat bottom surface 27 and a generally flat top surface 29. As a feature of the present invention, at least one fiducial 31 is provided in reference layer 25 and serves as an easily identifiable, fixed basis of reference, or comparison, throughout the fabrication process.

Fiducial 31 is represented herein as a relief structure, generally trapezoidal in transverse cross-section, that is raised above top surface 29 a defined height H. Formed as such, fiducial 31 defines an exposed, generally planar reference surface 33 which has a fixed width W.

It is to be understood that fiducial 31 could be formed into reference layer 25 using known nanoimprint lithographic techniques. As such, the relative size of each fiducial 31 could be constructed at micron, or even submicron, levels, thereby limiting its impact on the overall footprint of substrate 13.

As can be seen, reference surface 33 of fiducial 31 lies in a different plane than top surface 29. As a principal feature of the present invention, the multi-planar construction of reference layer 25 introduces a spatial phase delay into a source light $L_S$ illuminated onto substrate 13. This phase delay can, in turn, be used to maximize the optical contrast between surfaces 29 and 33 and thereby enable lithographic-style optical devices 19 to effectively function as web alignment instruments.

Specifically, source light $L_S$, with a wavelength λ and an amplitude A, illuminated onto reference layer 25 is reflected therefrom with a phase delay that is dependent upon the height differential between surfaces 29 and 33. Accordingly, by defining height H as one-quarter the wavelength of source light $L_S$ (i.e. λ/4), light L' is reflected from surface 33 out of phase by 180 degrees (i.e. by λ/2, or π) in relation to light L" reflected from surface 29, the reduction in height H by one-half of π being required since the light has to travel from optical device 19 to substrate 13 and, in turn, back to optical device 19.

By combining the reflected light L' and L" with an unaltered reference light $L_R$ from the same light source (i.e. device 19), principles of constructive and destructive interference can be used to maximize the contrast between light L' and L". In other words, constructive interference will cause reference light $L_R$ to double the amplitude, or brightness, of any reflected light in phase therewith. At the same time, destructive interference will cause reference light $L_R$ to cancel (i.e. effectively eliminate) the brightness of any reflected light which is 180 degrees out of phase therewith.

As a result, when viewed interferometrically (i.e. by optical device 19), alignment fiducials 31 can be detected relative to top surface 29 with maximum optical contrast. Consequently, when viewed relative to a reference waveform or beam $L_R$, the substrate background (i.e. surface 29) appears black when surface 33 appears white, and vice versa. Additionally, by utilizing a fiducial 31 with a width W at least as great as λ/2 A, the maximum amplitude, or brightness, of the white light detected by optical device 19 is possible in view of the resolution of its objective optics. As such, it is to be understood that the unique topography of the resultant web 13 enables optical devices 19 to readily identify fiducials 19 and, in turn, assist in the correction of any spatial or geometric variances in substrate 13, thereby ensuring proper alignment of substrate 13 at each processing station 17.

It should be noted that reference layer 25 need not be constructed of a highly reflective material (or applied with reflective coating) in order to achieve the desired interferometric contrast between fiducial 31 and top surface, or background, 29. Rather, it is to be understood that the desired interferometric contrast between surfaces 29 and 33 could be similarly achieved using a reference layer 25 that is not highly reflective. In this situation, source light $L_S$ could reflect of top surface 23-1 of base layer 23 instead of reference layer 25.

In order to achieve the same level of contrast between fiducial 31 and top surface 29 when a non-reflective reference layer 25 is utilized, the index of refraction N of reference layer 25 needs to be incorporated into the geometric aspects of fiducial 31. Specifically, height H of fiducial 31 is calculated as λ/(4*N) and width W is preferably calculated as at least as great as λ/(2*NA), with the index of refraction N for reference layer 25 preferably falling within the range of 1.3 to 2.0. Additionally, it is to be understood that the reflectivity of the reference mirror in optical device 19 preferably matches the reflectivity of reference layer 25 to ensure maximum constructive and destructive interference with the reflected source light.

It should also be noted that fiducial 31 need not be raised above top surface 29 to achieve maximum optical contrast. Rather, it is to be understood that fiducial 31 could be recessed below top surface 29 at a depth of λ/4, when a highly reflective reference layer 25 is utilized, in order to achieve a similar phase change of 180 degrees.

Figure 3:
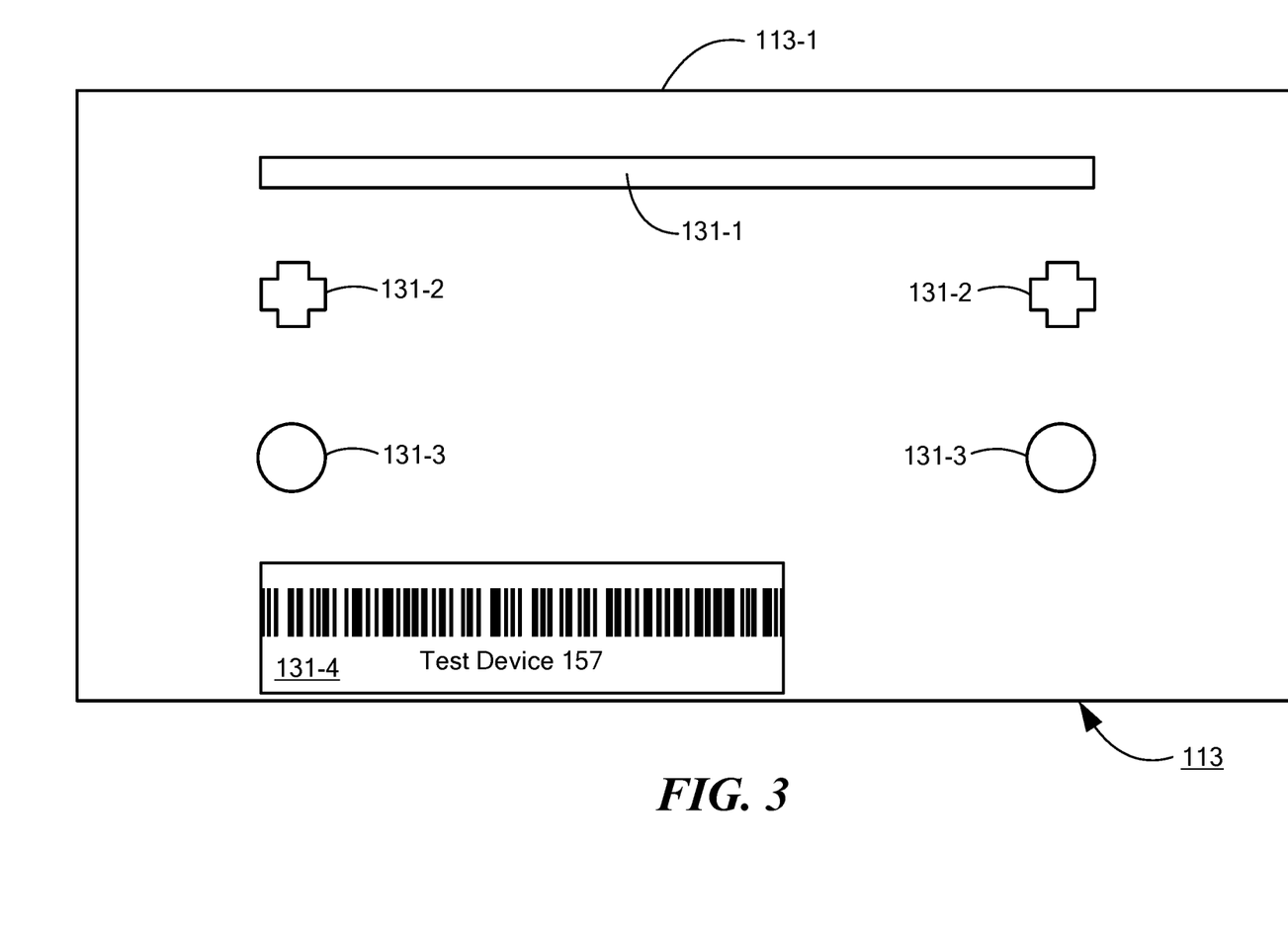
FIG. 3 is a top view of a sample section of the flexible substrate shown in FIG. 1 when viewed interferometrically under ideal conditions.

In the present invention, the particular number, shape and arrangement of fiducials 31 on substrate 13 could be modified to suit the particular needs of the fabrication process. Referring now to FIG. 3, there is shown a top view of a section of a sample substrate 113 when viewed interferometrically under ideal conditions (e.g. with no tilt present). As can be seen, substrate 113 is provided with a plurality of fiducials 131, each fiducial 131 being raised above the background surface at a height that achieves maximum contrast, as detailed above.

As can be seen, fiducials 131 are shown in a variety of different configurations. For instance, an elongated, linear, bar-like fiducial 131-1 is provided which extends in parallel, preferably in continuum, along one side edge 113-1 of substrate 113. As such, fiducial 131-1 could serve as a guide marker that can be used to ensure that web 113 travels along a consistent linear track.

A pair of cross-type fiducials 131-2 and a pair of flattened circular, or centroid-type, fiducials 131-3 is additionally provided on substrate 113. The use of a pair of complementary fiducials (e.g. fiducials 131-2 and 131-3) allows for alignment correction across either a larger, or global, scale or a smaller, or local, scale, with one of the fiducial pair being compared against known coordinates to evaluate misalignment in both the X and Y directions and the other of the fiducial pair being compared against the first fiducial to evaluate yaw, pitch and skew-type misalignment.

It should be noted that centroid-type fiducials 131-3 are preferred over most fiducial configurations since the 360 degree symmetrical nature of centroid-type fiducials 131-3 renders such fiducials 131-3 less sensitive to the orientation of optical device 19 (more specifically, the orientation of the pixels for the camera in device 19), thereby providing consistently higher resolution positioning data. Notably, centroid fiducials 131-3 provide 1/SQRT(N) sub-pixel resolution, where N is the full number of circumference pixels. By comparison, a straight line-type fiducial (e.g. fiducial 131-1) would have a relatively large, discrete pixel resolution of 1 pixel, since would take a translation of 1 full pixel width until the state of another pixel changes. However, it should be noted that the pixel resolution of a straight line-type fiducial could be improved simply by intentionally incorporating tilt into optical device 19, wherein a line-type fiducial with a tilt of 1/n would cause a pixel change state for every 1/n translation.

Lastly, a barcode-type fiducial 131-4 is provided on substrate 113, with each bar (or, in the alternative, the space between successive bars) being raised above the background of substrate 113 at the desired height to ensure maximum optical contrast (e.g. λ/4 for a fully-reflective reference layer). As can be appreciated, the design of fiducial 131-4 in the form of a barcode enables a unique code to be associated with substrate 113, which in turn can be used to identify, inter alia, the miniature structure being constructed or some other useful aspect pertaining to the field of view.

As will be explained further below, the utilization of a large quantity of fiducials 131 at various locations on substrate 113 can help identify both global and local distortions caused by external factors, such as heat and moisture. It is also important to note that fiducials 131 can be detected by optical devices 19, thereby eliminating the need for separate alignment cameras, even if a degree of tilt is present between substrate 113 and each optical device 19 (i.e. if the illumination path is not perfectly perpendicular to the surface of substrate 113).

Construction of Optical Device 19

As referenced above, each optical device 19 is preferably constructed as a hybrid of (i) a photolithography instrument that is capable directing light onto substrate 13 in a particular pattern, and (ii) an interferometer for optically detecting raised fiducials 31, or other surface patterns, on substrate 13 in order to ensure proper web alignment throughout the manufacturing process. By incorporating both features into a single instrument, the total number of components required for system 11 is lessened and, at the same time, the rate and accuracy in fabricating multi-layered structures on substrate 13 is improved. Accordingly, the particular construction of optical device 19 and its intended use within system 11 serves as a principal novel feature of the present invention.

Figure 4:
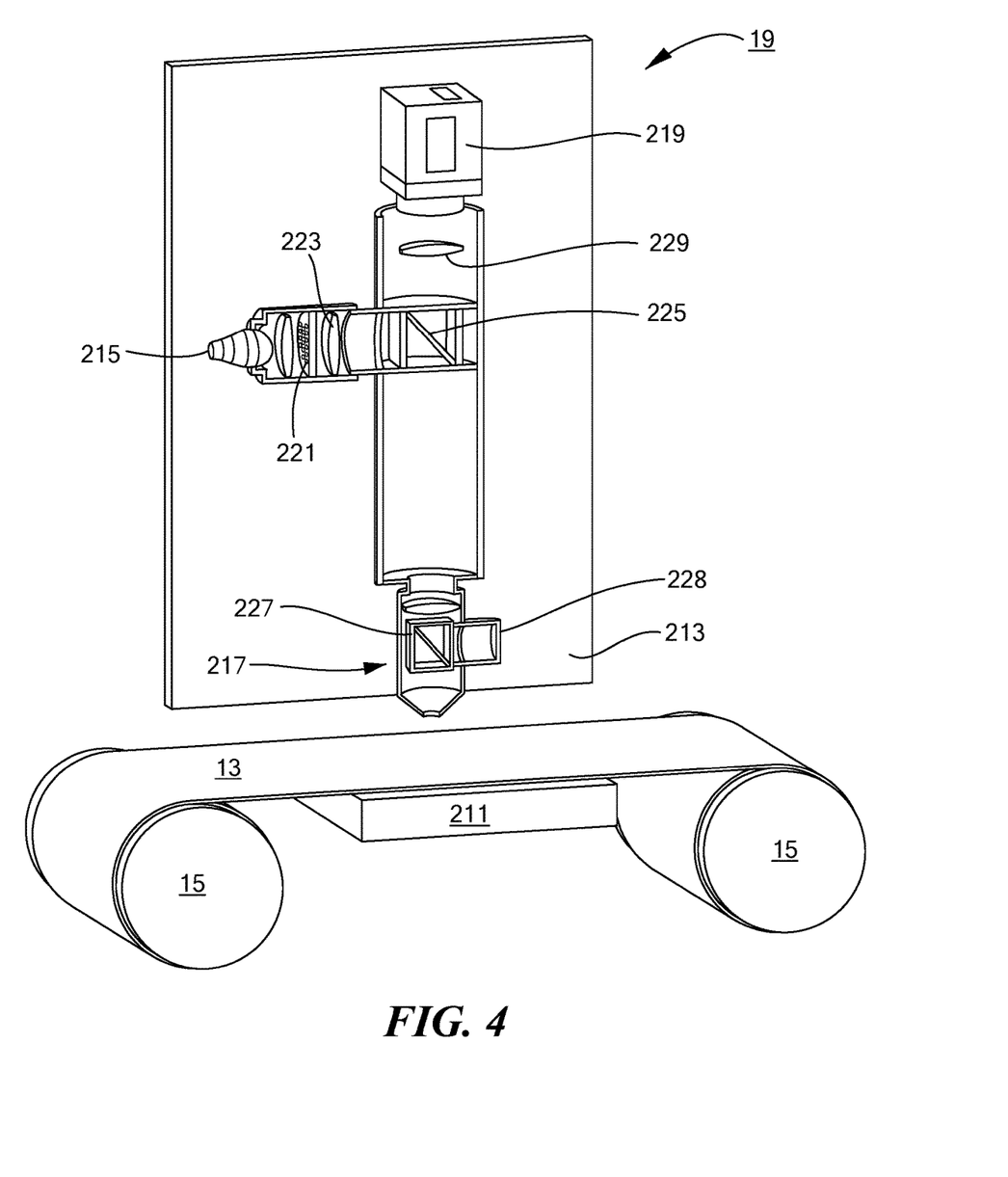
FIG. 4 is an enlarged, perspective view of one of the optical devices shown in FIG. 1 with selected components of the optical device being shown in section, the optical device being shown in relation to the web as transported by rollers, the rear surface of the web being shown supported by a planar member.

Referring now to FIG. 4, there is shown a front perspective view, represented partially in section, of an optical device 19 shown in relation to a web 13 transported at nominal tension by a pair of rollers 15, the rear surface of web 13 being shown supported by a planar member 211 that maintains web 13 flat and in its proper plane relative to device 19. Preferably, member 211 is constructed of a porous material or is provided with transverse holes to permit the delivery of either (i) pressurized air to ensure frictionless contact between member 211 and the rear surface of substrate 13 during web advancement or (ii) vacuum forces to retain substrate 13 firmly against member 211 to secure the web from moving (e.g. during a patterning step).

Optical device 19 comprises a motor-driven, movable mounting plate, or stage, 213 on which is disposed an illumination device, or lamp, 215 for supplying a source light (e.g. white light), an interferometric objective 217 for generating a test light beam and a reference light beam from the light source, and an imaging device, or camera, 219 for detecting the test and reference beams upon recombination, which in turn can be used to produce a surface map or otherwise extract surface measurement parameters for substrate 13. In this manner, lamp 215, objective 217, and camera 219 together function as an interferometer that can be used, inter alia, to identify fiducials 19 for alignment purposes, as will be explained further below.

Additionally, optical device 19 includes a spatial light modulator (SLM) 221 that can be used to spatially modulate light produced from lamp 215. In this manner, modulator 221 can project, or expose, a particular pattern of light onto a photo-sensitive layer on substrate 13 relative to fiducials 19 as part of a photolithographic process, as will be explained further below.

Illumination device 215 is preferably of the type that can provide illumination energy that can be used for both interferometric and photolithographic processes. Examples of light sources suitable for use as illumination device 215 include, but are not limited to, a mercury bulb, a laser source, or an ultraviolet (UV) light emitting diode (LED) (e.g. of the type sold by Luminus Devices, Inc., under model number CBT12-UV).

As can be seen, interferometric objective 217 comprises a condenser lens 223 that concentrates the source light produced by illumination device 215 (in the patterned region defined by SLM 221) and a beam splitter 225 that reflects the majority of the concentrated source light as (i) a test beam that is projected towards the test surface (i.e. substrate 13) within the SLM-defined region, and (ii) a reference beam, identical in intensity to the test beam, which is projected towards a partially reflective reference mirror 227 within the optical path. The test beam reflects off the test surface and recombines with the reference beam after the reference beam similarly reflects off reference mirror 228.

A portion of the recombined beams passes through splitter 225 and is collected by a tubus lens 229 for imaging onto a planar pixel array for camera 219. The pixilation information is then used with appropriate phase shifting software to map and measure surfaces with sub-nanometer vertical precision.

As will be explained further below, stage 213 is preferably designed to move in multiple dimensions to rectify both gross and acute errors in alignment between substrate 13 and device 19. Specifically, stage 213 is preferably able to move under motor control (i) in a transverse relationship relative to the advancement path of substrate 13, (ii) vertically in the focus direction, as well as (iii) rotationally among multiple axes so that fringes may be nulled and the image patterned onto substrate 13 is uniformly and crisply in focus (i.e. not distorted or otherwise out of focus).

As referenced briefly above, optical device 19 includes a spatial light modulator 221 that can be used to spatially modulate the intensity of light produced from lamp 215. SLM 221 can be designed to be (i) either light transmissive or reflective, and (ii) either controllable or static (e.g., in the form of photomask). Preferably, SLM 221 is of the controllable variety (e.g. an SLM of the type sold by Texas Instruments Incorporated under the DLP® DISCOVERY line of spatial light modulators) in order to allow for (i) the illumination of continuous light patterns which are larger than the field of view of the modulator and (ii) surface probing without exposing. As a result, SLM 221 could be utilized to illuminate a very small portion of the field (i.e. where fiducials 19 are generally located), thereby preventing the exposure of light onto a layer of photoresist on substrate 13 until proper alignment is finalized. In addition, a controllable SLM 221 enables surface mapping of small subsections of the field of view (which may be independently out of focus due to optical errors or the underlying topography of substrate 13) in order to yield a composite exposure that is uniformly in focus.

Alignment Method for Patterning on a Flexible Substrate

System 11 can be used in the following manner to pattern multiple layers onto a flexible substrate 13, with patterning precision ensured through a novel alignment method that relies upon the registration of alignment fiducials 31 on substrate 13. Specifically, referring back to FIG. 1, continuous web-like substrate 13 is shown advanced by rollers 15-1 thru 15-3 to a series of processing stations 17-1 thru 17-6. Together, stations 17 are responsible for, inter alia, patterning layers of material on substrate 13 in such a manner so as to yield the desired miniature structure.

As referenced above, each optical device 19 is designed to interferometrically detect fiducials 31 on substrate 13 for alignment purposes. Accordingly, as a first step in the novel fabrication process, it is envisioned that rollers 15 advance substrate 13 to at least one optical device 19 for global examination in order to detect any gross, large-scale variances in the overall geometry of substrate 13 as a result of external factors (e.g. tension, moisture, heat and the like). Once in place relative to optical device 19, substrate 13 is stopped by rollers 15 and held stable at normal tension, preferably with a vacuum applied thereto (e.g. through a planar support member 211) to ensure that substrate 13 is maintained in a fixed, generally planar orientation. Thereafter, an optical device 19 in alignment therewith can be used to globally scan substrate 13 and detect any gross variances in its overall geometry.

Figure 5:
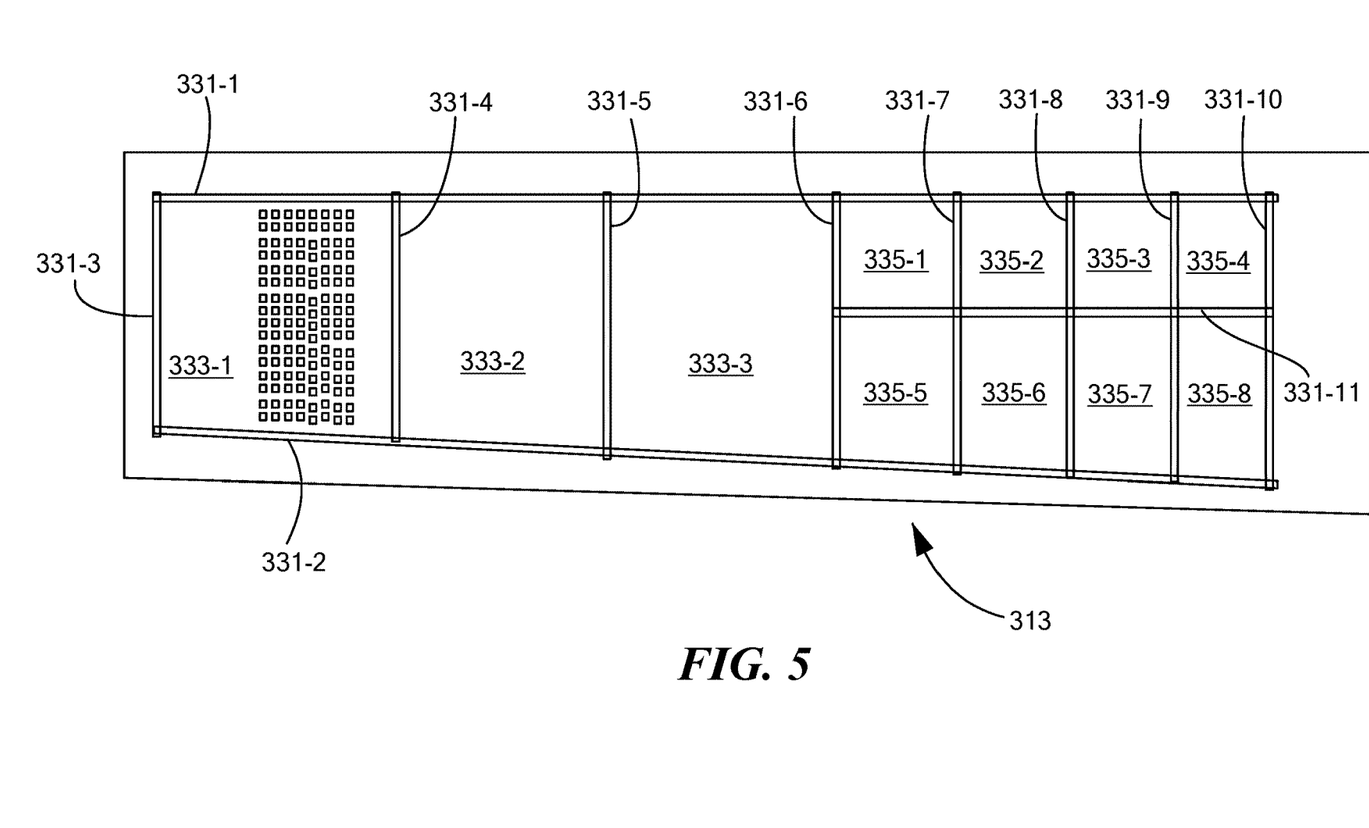
FIG. 5 is a simplified top plan view of a sample section of the substrate shown in FIG. 1, the substrate being shown provided an arrangement of fiducials.

Referring now to FIG. 5, there is shown a simplified top plan view of a sample section of a substrate 313 which includes an arrangement of global fiducials 331 useful in the detection of gross geometric variances. Specifically, substrate 313 is provided with a pair of longitudinal side member fiducials 331-1 and 333-2 extending along opposing sides of substrate 313, a plurality of cross member fiducials 331-3 thru 331-10 which extend transversely between fiducials 331-1 and 331-2, and a partitioning member fiducial 331-11 which extends longitudinally across the approximate midpoint of fiducials 331-6 thru 331-10.

For simplicity purposes only, each fiducial 331 is represented herein as being in the form of a bar-like fiducial (e.g. of the type shown as fiducial 131-1 in FIG. 4). However, it is to be understood that each fiducial 331 need not be limited to a bar-like configuration, but rather, could include one or more alternately shaped fiducials arranged in the same general alignment. For instance, it is preferred that centroid-like fiducials (e.g. of the type shown as fiducial 131-3 in FIG. 4) be located at the junction of transecting fiducials 331 and, in addition, at the midpoint of each bar-like fiducial 331 to detect any web narrowing.

Together, fiducials 331 define, or frame, a series of larger exposure fields 333-1 thru 333-3 and a series of smaller exposure fields 335-1 thru 335-8. As can be appreciated, sub-global fiducials (not shown) may be placed within smaller exposure fields 335 to provide fine targeted alignment (i.e. alignment within one particular smaller field 335 and not a greater section of substrate 313).

In the present example, side member fiducials 331-1 and 331-2 extend in a non-parallel relationship (e.g. due to non-uniform lateral strain applied to substrate 313 by external factors). As can be appreciated, this gross distortion of substrate 313 can significantly compromise the accuracy of subsequent patterning steps.

Consequently, a coarse scan of fiducials 331 by optical device 19 would detect the undesired geometric strain on substrate 313. In response thereto, a processor (not shown), which is programmed with the necessary software, would cause web adjustment element 21 to treat substrate 313 in such a manner to eliminate the variance (i.e. to restore substrate 13 to its original geometry with fiducials 331-1 and 331-2 arranged substantially in a parallel).

Figure 6:
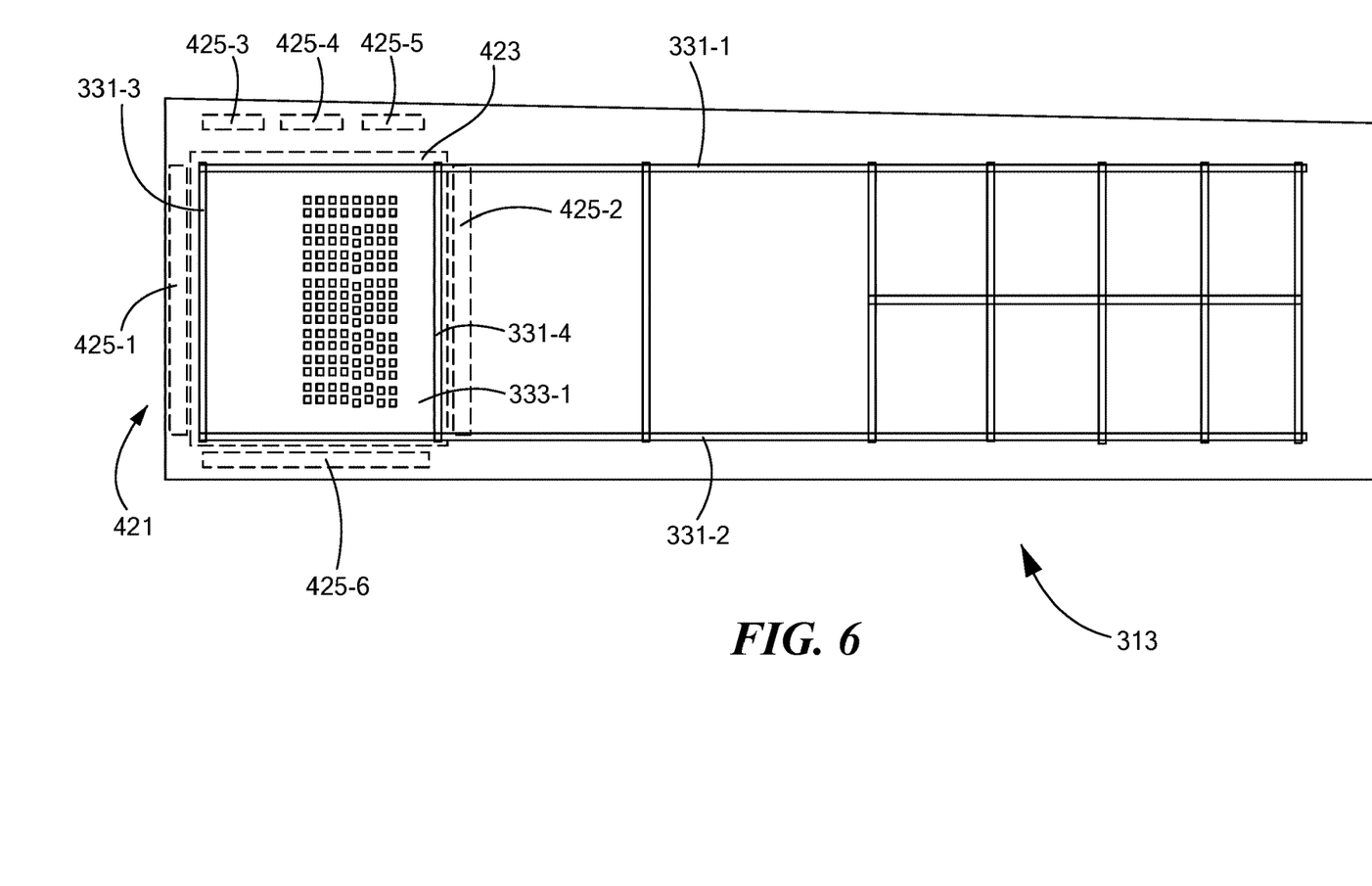
FIG. 6 is a simplified top plan view of the sample section of the substrate shown in FIG. 5, the substrate being shown in position above a web adjustment element that utilizes tension to correct gross geometric variances, the web adjustment element being shown in dashed form.

For example, web adjustment element 21 may utilize tension to correct gross geometric variances in substrate 313. Referring now to FIG. 6, substrate 313 in shown in relation to a web adjustment element 421 that utilizes tension to correct gross geometric variances. Web adjustment element 421 is preferably mounted on a polished smooth support element 423 and includes a pair of transverse tension bars 425-1 and 425-2, a series of longitudinal tension bars 425-3 thru 425-5, and a single opposing tension bar 425-6. Together, tension bars 425 are arranged in alignment around the periphery of one large exposure field 333-1 and, as such, can be used to restore the desired geometry of that particular field 333-1 (i.e. rather than the entirety of substrate 313).

Web treatment may be performed by gripping substrate 313 with transverse tension bars 425-1 and 425-2 (e.g. using clamping and/or vacuum forces). Tension bars 425-1 and 425-2 are then displaced, as needed, to correct for global (i.e. large-scale) longitudinal errors (i.e. variances within field 333-1 in relation to the longitudinal axis) that are detected through inspection of side fiducials 331-1 and 331-2.

Thereafter, tension bars 425-3 thru 425-6 are similarly utilized to check the transverse geometric aspects of field 333-1, since the width of field 333-1 (as determined through inspection of cross fiducials 331-3 and 331-4 is affected proportionally to Poisson's ration. Using tension bar 425-6 as the datum bar, one or more of tension bars 425-3 may selectively apply localized displacement of substrate 313 to correct for any bowing or other similar variance.

Figure 7:
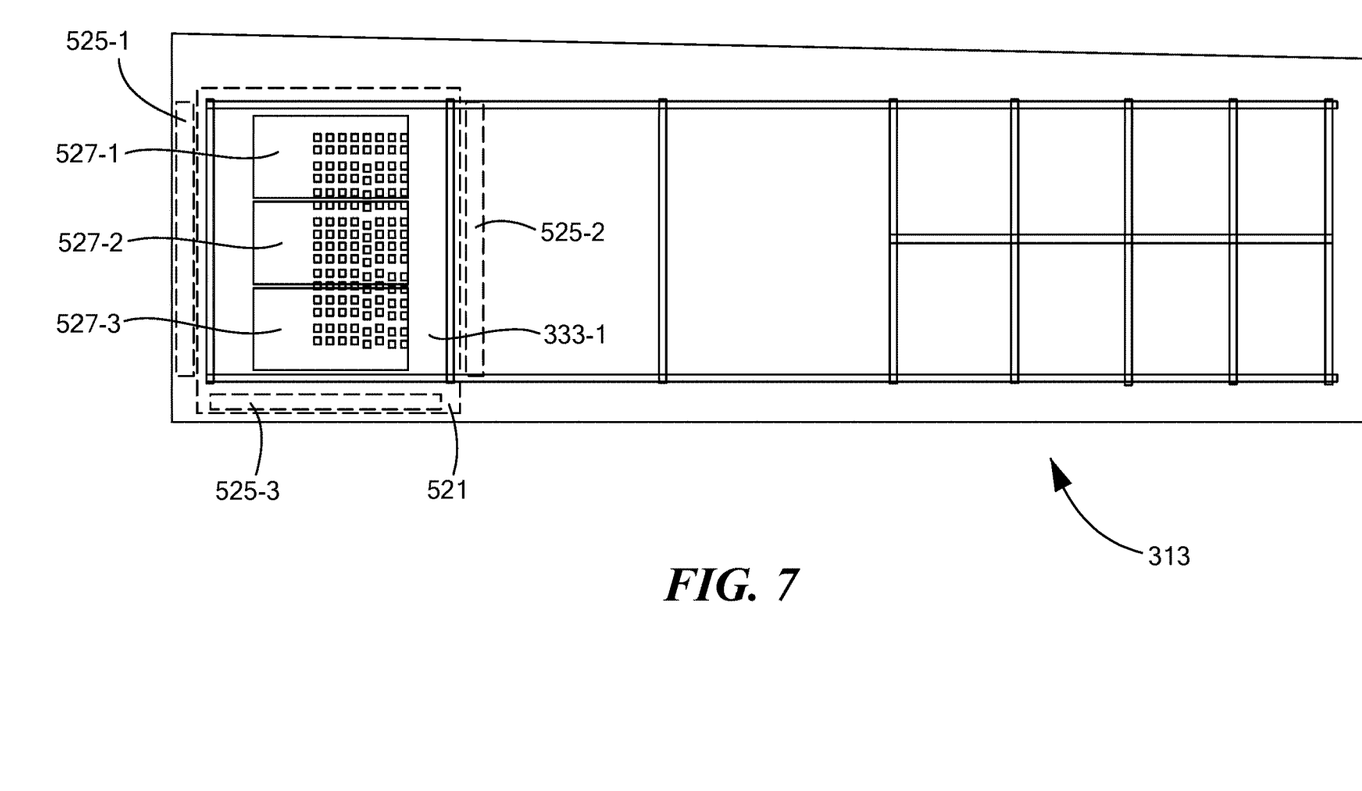
FIG. 7 is a simplified top plan view of the sample section of the substrate shown in FIG. 5, the substrate being shown in position above a web adjustment element that utilizes heat to correct gross geometric variances, the web adjustment element being shown in dashed form.

As another example, web adjustment element 21 may utilize heat to correct gross geometric variances in substrate 313, which is preferred over the use of tension since there is less cumulative stress applied to substrate 313. Referring now to FIG. 7, there is shown substrate 313 in relation to a web adjustment element 521 that utilizes heat to correct gross geometric variances.

As can be seen, web adjustment element 521 is similar to web adjustment element 421 in that web adjustment element 521 includes a pair of transverse tension bars 525-1 and 525-2 as well as a longitudinal tension bar 525-3 that are arranged around the periphery of three sides of one large exposure field 333-1. Web adjustment element 521 differs from web adjustment element 421 in that web adjustment element 521 includes three, equal-sized, heating plates 527-1 thru 527-3 that are arranged as three distinct zones within exposure field 333-1. In use, each plate 527 can be set at a specified temperature, the variance in temperature between plates 527 causing the dimensions of substrate 313 within exposure field 333-1 to change accordingly. Accordingly, if heat is applied unevenly by plates 527, one side of substrate 313 would expand to a larger extent than the other, thereby resulting in curvature in substrate 313. Imparting curvature into substrate 313 can be used intentionally to correct distortion as well as direct substrate 313 along a correspondingly curved track.

With gross geometric variances in substrate 313 corrected in the manner set forth above, each optical device 19 is then adjusted to compensate for the presence of tilt fringes. As can be appreciated, tilt fringes are interferometerically observed in a plane surface when the test beam provided by optical device 19 projects in a non-orthogonal relationship relative to substrate 313. This angular offset, or tilt, of the test beam causes both constructive and destructive interference which, in turn, results in the generation of an alternating pattern of light and dark fringes.

The period of the fringe pattern (i.e. the distance between either successive constructive fringes or successive destructive fringes) can be measured by optical device 19 and, in turn, used to calculate the tilt angle θ, since the fringe period $P=\lambda/2 \sin \theta$. Accordingly, the calculated information can be used to adjust optical device 19 (via stage 213) so as to remove the presence of tilt. With optical device 19 properly oriented relative to substrate 13, a patterned image would be projected by optical device 19 at a right angle relative to an exposed photoresist layer on substrate 13 and therefore be uniformly in focus, which is highly desirable.

After adjusting the tilt angle of each optical device 19 in the manner set forth above, optical device 19 can be used to pattern photoresist on substrate 13 in the following manner. First, global fiducials 31 on substrate 13 are located by optical device 19 and the X, Y, and Z coordinates for each fiducial 31 are recorded. Using the recorded coordinates for each fiducial, the coordinate axes for each optical device 19 can be calculated and scaled, as needed, in order to properly calibrate each patterning instrument. In the alternative, rather than recalibrate the orientation of the axes for each optical device 19, it is to be understood that the desired image to be projected by optical device 19 could be distorted to compensate for any misalignment relative to web 13.

Upon completion of the gross adjustment of each optical device 19, fine adjustment of each device 19 is achieved by projecting a test image (e.g. a point) relative to one or more fiducials 31. The location of the test image (relative to the designated fiducials 31) on spatial light modulator 402 is compared against the location of the test image (relative to the designated fiducials 31) measured on substrate 13 using interferometry. Any offset in the location of the test image is recorded and, in turn, utilized to modify the pattern on SLM 402 in accordance therewith. With the pattern adjusted to compensate for any acute alignment discrepancy, photolithographic patterning of substrate 13 can be performed.

It should be noted that acute adjustment of optical device 19 using a projected test image initially requires the Z axis needs to be scanned vertically through $\pi/2$ or $\lambda/4$ in order to identify and record the brightest pixels. Recordation of the brightest pixels is required because destructive interference will null portions of the image. However, by shifting the brightest pixels by $\pi$, any destructive interference will become constructive interference and, accordingly, the null portions will be eliminated. The actual location of the bright image on web 13 should then be compared against the location of the corresponding image on SLM 402 to compute the acute offset or overlay error. The optical column for device 19 should be translated accordingly and/or SLM pixels shifted until minimal error is achieved.

Referring back to FIG. 1, stations 17-1 thru 17-4 are capable of photolithographic patterning of web-like substrate 13 in the manner set forth in detail above. In addition to photolithographic patterning, system 11 is also capable of imprint lithographic patterning, with all patterned layers being properly aligned through detection of fiducials 31.

In particular, station 17-5 provides system 11 with imprint lithography capabilities. Specifically, station 17-5 includes an embossing roller 601 which cooperates with pinch roller 15-2 to emboss web 13 with a defined pattern. Using the fiducial information collected by optical devices 19, strain and/or thermal correction can be applied to web 13 prior to embossing by roller 601.

It should be noted that, contrary to the construction of traditional imprint lithography systems, web 13 wraps partially around pinch roller 15-2, but is limited to a linear region of contact with embossing roller 601. This construction is required in order to minimize the retentive force applied onto web 13 at station 17-5 and thereby allow for selective web geometry correction, as detailed above.

Traditional wetting and gelling of polymer web 13 is not possible in the present construction since the process causes adhesion in the web, which makes subsequent web correction very difficult or even impossible at the required resolution. Consequently, in order to wet embossing roller 601, material may be applied to roller 601 using an inkjet 603 or a transfer roller (not shown). Another strategy for applying material to web 13 is to slowly steer embossing roller 601 at a rate that only slightly distorts features fabricated on web 13 and, subsequent thereto, curing such distortions by applying light from a focused light source 605 (e.g. laser) outside of the field being embossed.

After completion of imprint lithography processes, web 13 is flood cured with a flood lamp 607 at station 17-6. After the flood curing step, the process for fabricating miniature structures on flexible substrate 13 is complete.

In addition to alignment and patterning, an optical device 19 located at a post-patterning station (e.g. station 17-4) could be utilized additionally as inspection device with extremely sensitive, nanometer class, vertical measurement capabilities. Accordingly, using the z-axis to phase modulate the inspection beam under low intensity illumination, device 19 can be utilized not only to measure the height of certain features on web 13 (to determine and correct fabrication errors) but also to detect dust or other contaminants which may compromise the resultant functionality of the fabricated structure.

The embodiments shown above are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A system for fabricating miniature structures, the system comprising:
    (a) a flexible substrate on which the miniature structures are fabricated, the flexible substrate having at least one fiducial arranged in a first geometric pattern;
    (b) an optical device for measuring a variance in the first geometric pattern of the at least one fiducial on the flexible substrate; and
    (c) a web adjustment element for selectively treating the flexible substrate so as to correct the variance in the first geometric pattern of the at least one fiducial on the flexible substrate and restore the at least one fiducial on the flexible substrate to the first geometry.

2. The system as claimed in claim 1 wherein the substrate is constructed as a continuous web of material.

3. The system as claimed in claim 1 wherein the web adjustment element selectively applies heat to the flexible substrate to correct the variance in the first geometric pattern of the at least one fiducial on the flexible substrate and restore the at least one fiducial on the flexible substrate to the first geometry.

4. The system as claimed in claim 1 wherein the web adjustment element selectively applies tension to the flexible substrate to correct the variance in the first geometric pattern of the at least one fiducial on the flexible substrate and restore the at least one fiducial on the flexible substrate to the first geometry.

5. The system as claimed in claim 3 wherein the web adjustment element comprises a plurality of independently operable heating plates for selectively applying heat to the flexible substrate.

6. The system as claimed in claim 4 wherein the web adjustment element comprises a plurality of displaceable tension bars for selectively applying tension to the flexible substrate.

* * * * *